(12) United States Patent
Radtke et al.

(10) Patent No.: US 7,714,592 B2
(45) Date of Patent: May 11, 2010

(54) SYSTEM AND METHOD FOR DETERMINING THE IMPEDANCE OF A MEDIUM VOLTAGE POWER LINE

(75) Inventors: William O. Radtke, Ellicott City, MD (US); David G. Kreiss, San Diego, CA (US)

(73) Assignee: Current Technologies, LLC, Germantown, MD (US)

( * ) Notice: Subject to any disclaimer, the term of this patent is extended or adjusted under 35 U.S.C. 154(b) by 70 days.

(21) Appl. No.: 11/936,275

(22) Filed: Nov. 7, 2007

(65) Prior Publication Data

US 2009/0115427 A1    May 7, 2009

(51) Int. Cl.
*G01R 27/04* (2006.01)

(52) U.S. Cl. .................. 324/629; 324/650

(58) Field of Classification Search ............. 324/629
See application file for complete search history.

(56) References Cited

U.S. PATENT DOCUMENTS

| | | | |
|---|---|---|---|
| 4,635,055 A | 1/1987 | Fernandes et al. | |
| 4,758,962 A | 7/1988 | Fernandes | |
| 5,006,846 A | 4/1991 | Granville et al. | |
| 5,369,356 A | 11/1994 | Kinney et al. | |
| 5,498,956 A | 3/1996 | Kinney et al. | |
| 5,760,492 A | 6/1998 | Kanoi et al. | |
| 5,777,545 A | 7/1998 | Patel | |
| 6,151,330 A | 11/2000 | Liberman | |
| 6,828,770 B1 | 12/2004 | McCauley et al. | |
| 6,917,888 B2 | 7/2005 | Logvinov et al. | |
| 7,069,117 B2 | 6/2006 | Wilson et al. | |
| 7,089,125 B2 | 8/2006 | Sonderegger | |
| 7,355,416 B1 * | 4/2008 | Darshan | 324/713 |
| 2001/0052843 A1 | 12/2001 | Wiesman et al. | |
| 2002/0000802 A1 | 1/2002 | Panto et al. | |
| 2003/0067725 A1 | 4/2003 | Horvath et al. | |
| 2003/0105608 A1 | 6/2003 | Hart | |
| 2003/0137388 A1 | 7/2003 | Meier et al. | |
| 2004/0021455 A1 | 2/2004 | Staats | |
| 2004/0160227 A1 | 8/2004 | Piesinger | |
| 2004/0183522 A1 | 9/2004 | Gunn et al. | |
| 2004/0212512 A1 | 10/2004 | Stewart | |

(Continued)

OTHER PUBLICATIONS

"Centralized Commercial Building Applications with the Lonworks ® PLT-21 Power Line Transceiver", *Lonworks Engineering Bulletin*, Echelon, (Apr. 1997),1-22.

*Primary Examiner*—Timothy J Dole
*Assistant Examiner*—Benjamin M Baldridge
(74) *Attorney, Agent, or Firm*—Mel Barnes; Capital Legal Group, LLC

(57) ABSTRACT

A system and method of detecting changes in the impedance of a segment of medium voltage power line is provided. In one embodiment, the method comprises receiving voltage data comprising data of the voltage of the power lines at locations at a plurality of different points in time, receiving current data that comprises data of the current flowing between adjacent locations at the plurality of points in time, intermittently determining an impedance of the power lines between adjacent locations based on the voltage data and current data, monitoring the impedance of the power lines between adjacent locations over time, and providing a notification of a change in the impedance of a power line between adjacent locations upon detection of a change in the impedance beyond a threshold change.

19 Claims, 6 Drawing Sheets

U.S. PATENT DOCUMENTS

| | | |
|---|---|---|
| 2005/0040809 A1 | 2/2005 | Uber, III et al. |
| 2005/0083206 A1 | 4/2005 | Couch et al. |
| 2005/0141682 A1 | 6/2005 | Wells |
| 2006/0007016 A1 | 1/2006 | Borkowski et al. |
| 2006/0036795 A1 | 2/2006 | Leach |
| 2006/0060007 A1 | 3/2006 | Mekhanoshin et al. |
| 2006/0076946 A1 | 4/2006 | Shvach et al. |
| 2006/0084419 A1 | 4/2006 | Rocamora et al. |
| 2006/0087777 A1 | 4/2006 | Bruno |
| 2006/0095219 A1* | 5/2006 | Bruno .................. 702/64 |
| 2006/0106554 A1 | 5/2006 | Borkowski et al. |
| 2006/0187074 A1 | 8/2006 | O'Sullivan et al. |
| 2006/0192672 A1 | 8/2006 | Gidge et al. |
| 2006/0195229 A1 | 8/2006 | Bell et al. |
| 2006/0217058 A1 | 9/2006 | Staszesky et al. |
| 2006/0241880 A1 | 10/2006 | Forth et al. |
| 2006/0271313 A1 | 11/2006 | Mollenkopf |
| 2006/0284647 A1 | 12/2006 | Gunn et al. |
| 2007/0014313 A1 | 1/2007 | Bickel et al. |
| 2007/0024264 A1 | 2/2007 | Lestician |
| 2007/0090811 A1 | 4/2007 | Labuschagne |
| 2007/0108986 A1* | 5/2007 | Moore et al. ............... 324/522 |
| 2007/0136010 A1 | 6/2007 | Gunn et al. |
| 2007/0179721 A1 | 8/2007 | Yaney |
| 2007/0179726 A1 | 8/2007 | Bickel |
| 2007/0185665 A1 | 8/2007 | Roytelman |
| 2007/0203658 A1 | 8/2007 | Pater |
| 2007/0213879 A1 | 9/2007 | Iwamura |
| 2007/0219755 A1 | 9/2007 | Williams et al. |
| 2007/0229295 A1 | 10/2007 | Curt et al. |
| 2007/0285079 A1 | 12/2007 | Nasle |
| 2008/0007416 A1 | 1/2008 | Cern |
| 2008/0077336 A1 | 3/2008 | Fernandes |
| 2008/0122642 A1 | 5/2008 | Radtke et al. |
| 2008/0189061 A1* | 8/2008 | Scholtz et al. ............... 702/65 |
| 2008/0204054 A1 | 8/2008 | Wells |

* cited by examiner

SYSTEM AND METHOD FOR DETERMINING THE IMPEDANCE OF A MEDIUM VOLTAGE POWER LINE

FIELD OF THE INVENTION

The present invention generally relates to systems, methods and devices for determining the impedance of a power line, and more particularly to systems, methods and devices for determining the impedance of a medium voltage power line, determining a change in the impedance, and for communicating data of the impedance and/or change in the impedance.

BACKGROUND OF THE INVENTION

Electrical power for consumption at residences, offices and other structures is delivered by a power distribution system. A power distribution system may include numerous sections, which transmit power at different voltages. A section of high voltage power transmission lines forms a power distribution grid for transmitting power from a power plant to substations near populated areas. Various medium voltage (MV) power sections are coupled to the grid via substations to serve specific regions. An MV power section includes medium voltage power lines carrying power having a voltage in the range of 1,000V to 100,000V. Low voltage (LV) power sections are coupled to the MV power lines via distribution transformers to serve specific groups of structures such as homes. In the United States, the LV power lines typically carry voltages of approximately 120V phase to ground and 240V phase to phase.

The power distribution system includes transformers, switching devices, other devices, and miles of power lines. Maintaining the system in effective working order is imperative for the individual consumer and society. Maintenance is used to identify signs of potential failure and better manage distribution and redistribution of power to satisfy local needs. Even with such maintenance, however, faults occasionally occur, which often result in a power outage thereby preventing power delivery. Power outages also may occur due to other events, such as when inclement weather conditions or falling tree branches knock down power lines. It is desirable that the utility operator quickly identify and respond to such power distribution events to minimize the adverse impact to the power distribution system and to the consumers. In particular, it is desirable to determine that an adverse power distribution event is imminent, may occur, or has occurred, and the location of such an event.

As discussed, medium voltage power lines are typically connected to a plurality of distribution transformers, which supply power to the consumers. While the current (amperage) of the medium voltage power line varies according to the load, the impedance of the medium voltage power line will remain substantially constant between two locations on the medium voltage (MV) power line. Thus, a change in the impedance of the medium voltage power line may indicate an undesirable condition exists and/or that an adverse power distribution is imminent. As an example, if a tree limb intermittently touches an uninsulated overhead MV power line, the tree will provide a path to ground for power. This additional and intermittent electrical path to ground will change the impedance of the power line between two locations on either side of the tree limb. Consequently, measuring the impedance of the power line and monitoring the impedance over time to detect a change in impedance can be instrumental in identifying power distribution system events before they become more serious (e.g., the tree limb breaking the power line).

Accordingly, there is a need to measure the impedance of a medium voltage power line and to detect significant changes in the impedance in order to identify existing and/or imminent adverse power line distribution events. Another need is to obtain sufficient data to locate and respond to the existing or imminent power distribution event. Various embodiments of the present invention may satisfy one or more of these needs and/or others.

SUMMARY OF THE INVENTION

The present invention provides a system and method of determining the impedance of a power line and for detecting changes in the impedance. In one embodiment, the method comprises receiving voltage data comprising data of the voltage of the power lines at each of a plurality of locations at a plurality of different points in time, receiving current data that comprises data of the current flowing between adjacent locations of the plurality of locations at the plurality of points in time, intermittently determining an impedance of the power lines between a plurality of adjacent locations based on the voltage data and current data, monitoring the impedance of the power lines between adjacent locations over time, and providing a notification of a change in the impedance of a power line between adjacent locations upon detection of a change in the impedance beyond a threshold change. In one embodiment, the impedance between adjacent locations is determined by determining a voltage change for each location over time, determining a corresponding current change comprising a change in the current flowing between adjacent locations over the time; and dividing the difference between the voltage changes of adjacent locations by the change in current flowing between the adjacent locations.

The invention will be better understood by reference to the following detailed description taken in conjunction with the accompanying drawings.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and instrumentalities shown. In the drawings.

DETAILED DESCRIPTION OF ILLUSTRATIVE EMBODIMENTS

Figure 1:
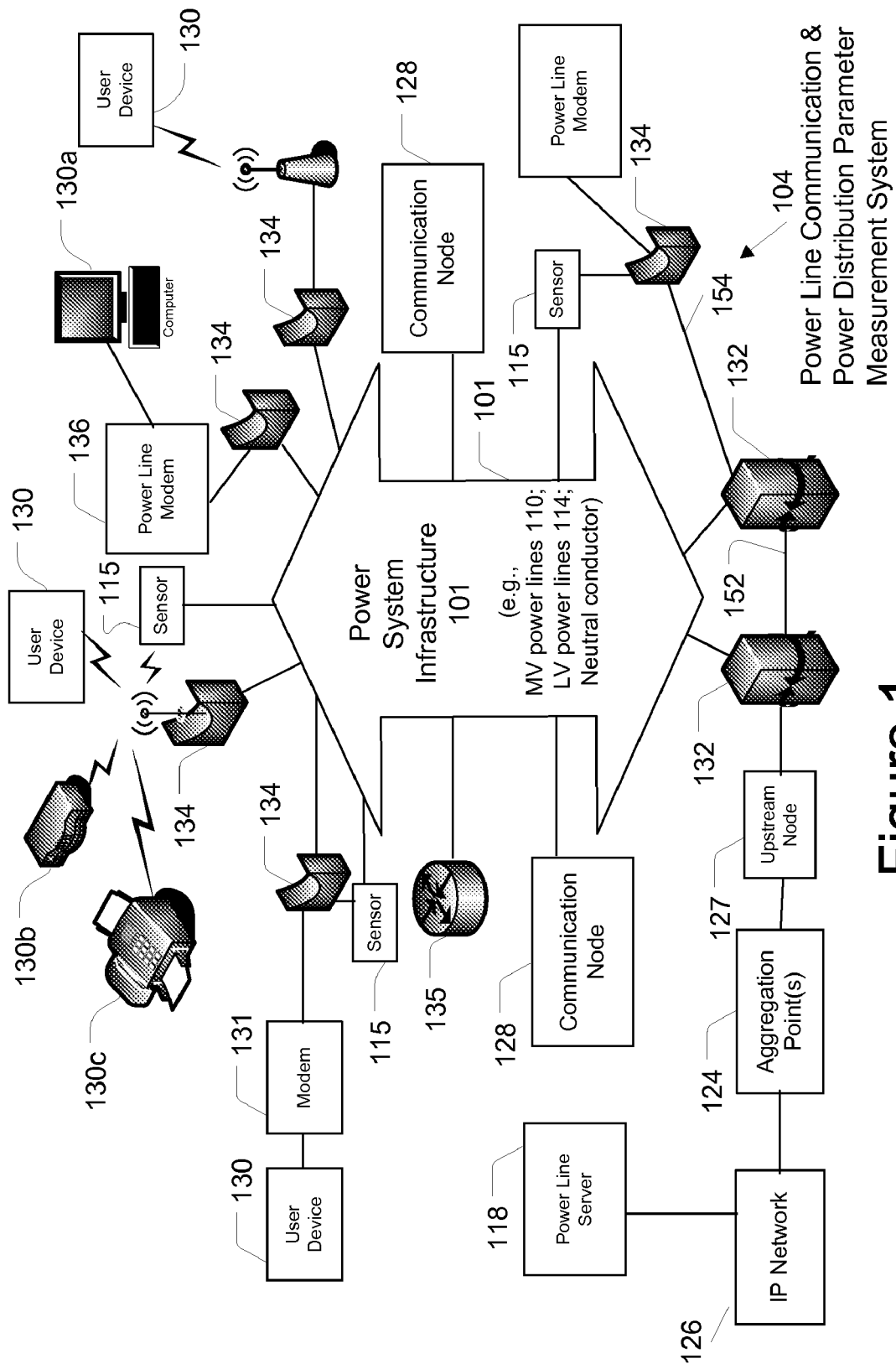
FIG. 1 is a block diagram of an example power line communication system for implementing some embodiments of the present invention.

In the following description, for purposes of explanation and not limitation, specific details are set forth, such as particular networks, communication systems, computers, terminals, devices, sensor devices, measurement techniques, estimating techniques, components, techniques, data and network protocols, power line communication systems (PLCSs), software products and systems, enterprise applications, operating systems, development interfaces, hardware, etc. in order to provide a thorough understanding of the present invention.

However, it will be apparent to one skilled in the art that the present invention may be practiced in other embodiments that depart from these specific details. Detailed descriptions of well-known networks, sensor devices, measurement techniques, estimating techniques, communication systems, computers, terminals, devices, PLCSs, components, techniques, data and network protocols, software products and systems, operating systems, development interfaces, and hardware are omitted so as not to obscure the description of the present invention.

Following is a description of example embodiments of a power line communication system that includes a power line parameter measurement system. The PLCS may include power line parameter sensor devices, various communication devices, communication protocols, and implementation software. Also described are exemplary network topologies. Such systems and devices may be implemented in various embodiments to determine the impedance of a power line and locate changes in the impedance of a power line, including in both overhead and underground power lines. According to various embodiments, the power line communication devices and sensor devices may be located throughout the power distribution system to obtain, process, and communicate power line parameter data such as current and voltage data.

As discussed, a power distribution event may comprise a power line fault or a power outage. These events sometimes may be preceded by a change in impedance of a medium voltage power line. In some embodiments, the power line communication devices described herein may be configured to process power line parameter data collected from one or more sensor devices to determine the impedance of the MV power line and to monitor the impedance on an ongoing basis. In addition, upon detection of a change in impedance beyond a predetermined amount, the device may provide a notification of such an event and location data thereof to a remote computer system.

In other embodiments, the power line communications devices may be configured to measure the parameter data (e.g., voltage and current) and to transmit the data to a remote computer system for processing. The remote computer system may then determine the impedance of the power line between a plurality of adjacent power line communication devices and to detect changes in the determined impedances over time. Upon detection of a change beyond a predetermined amount, the computer may be configured to provide a notification (along with location information), such as a transmission to the utility provider so that the utility can dispatch personnel to investigate and/or resolve the condition.

Power Line Communication and Sensor System

The power line communication system of the present invention may gather power distribution parameter data from multiple points along a power distribution network and transmit the gathered data to a remote computer utility operator or other processing center. For example, sensor devices may be positioned along overhead and underground medium voltage power lines, and along (external and/or internal) low voltage power lines. As discussed, the power line parameter data may be used to determine the impedance of a power line over time, to detect changes in that impedance to identify an existing or imminent adverse condition.

The power line communication system, as the example system illustrated in FIG. 1, also may provide user communication services, such as high speed broadband internet access, mobile telephone communications, other broadband communications, digital television, VoIP telephone service, streaming video and audio services, and other communication services to homes, buildings and other structures, and to each room, office, apartment, or other unit or sub-unit of multi-unit structures. Communication services also may be provided to mobile and stationary devices in outdoor areas such as customer premises yards, parks, stadiums, and also to public and semi-public indoor areas such as subway trains, subway stations, train stations, airports, restaurants, public and private automobiles, bodies of water (e.g., rivers, bays, inlets, etc.), building lobbies, elevators, etc.

In some embodiments, a power line parameter sensor device is installed at one or more communication nodes to measure power line parameters of various regions, neighborhoods and structures. The power parameter sensor device may measure (meant to include measure or detect) one or more electrical distribution parameters, which may include, for example purposes only, power usage, power line voltage, power line current, detection of a power outage, detection of water in a pad mount, detection of an open pad mount, detection of a street light failure, power delivered to a transformer, power factor (e.g., the phase angle between the voltage and current of a power line), power delivered to a downstream branch, power line temperature, impedance, data of the harmonic components of a power signal, load transients, and/or load distribution. One skilled in the art will appreciate that other types of parameter data also may be measured or detected. The data may be processed by the nearby node and/or communicating to a remote device (e.g., the utility operator, a PLS) for processing.

FIG. 1 depicts components of a power line communication system that may be used to also provide a power distribution parameter measurement system. The system 104 includes a plurality of communication nodes 128 which form communication links using power lines 110, 114 and other communication media. Various user devices 130 and power line communication devices may transmit and receive data over the links to gain access to (and communicate over an) IP network 126 (e.g., the Internet). Thus, the communicated data may include measurement data of power distribution parameters, control data and user data. Communication nodes 128 may be any of a backhaul node 132, an access node 134, or a repeater node 135. A given node 128 may serve as a backhaul node 132, access node 134, and/or repeater node 135.

A communication link may be formed between two communication nodes 128 over a communication medium. Some links may be formed over MV power lines 110 and others over LV power lines 114. Other links may be gigabit-Ethernet links 152, 154 formed, for example, via a fiber optic cable. Thus, some links may be formed using a portion 101 of the power system infrastructure, while other links may be formed over another communication media, (e.g., a coaxial cable, a T-1 line, a fiber optic cable, wirelessly (e.g., IEEE 802.11a/b/g/n, 802.16, 1G, 2G, 3G, or satellite such as WildBlue®)). The wireless links may also use any suitable frequency band. In one example, frequency bands are used that are selected from among ranges of licensed frequency bands (e.g., 6 GHz, 11 GHz, 18 GHz, 23 GHz, 24 GHz, 28 GHz, or 38 GHz band) and unlicensed frequency bands (e.g., 900 MHz, 2.4 GHz, 5.8 GHz, 24 GHz, 38 GHz, or 60 GHz (i.e., 57-64 GHz)). Some links may comprise wired Ethernet, multipoint microwave distribution system (MMDS) standards, DOCSIS (Data Over Cable System Interface Specification) signal standards or another suitable communication method. The links formed by wired or wireless media may occur at any point along a communication path between an end device and the internet (or other device).

Communication among nodes 128 may occur using a variety of protocols and media. In one example, the nodes 128 may use time division multiplexing and implement one or more layers of the 7 layer open systems interconnection (OSI) model. For example, at the layer 3 'network' level, the devices and software may implement switching and routing technologies, and create logical paths, known as virtual circuits, for transmitting data from node to node. Similarly, error handling, congestion control and packet sequencing can be performed at Layer 3. In one example embodiment, Layer 2 'data link' activities include encoding and decoding data packets and handling errors of the 'physical' layer 1, along with flow control and frame synchronization. The configuration of the various communication nodes may vary. For example, the nodes coupled to power lines may include a modem that is substantially compatible with the HomePlug 1.0, Turbo or A/V standard. In various embodiments, the communications among nodes may be time division multiple access or frequency division multiple access.

Each communication node 128 may be formed by one or more communication devices. Communication nodes which communicate over a power line medium include a power line communication device. Exemplary power line communication devices include a backhaul device 138, an access device 139, and a power line repeater 135. Communication nodes 128 which communicate wirelessly may include a mobile telephone cell site, a WiMAX cell site, or a wireless access point having at least a wireless transceiver. Communication nodes which communicate over a coaxial cable may include a cable modem or other modem. Communication nodes which communicate over a twisted pair wire may include a DSL modem or other modem. A given communication node typically will communicate in two directions (either full duplex or half duplex), which may be over the same or different types of communication media. Accordingly, a communication node 128 may include one, two or more communication devices.

A backhaul node 132 may serve as an interface between a power line (e.g., an MV power line 110) and an upstream node 127, which may be, for example, connected to an aggregation point 124 that may provide a connection to an IP network 126 such as the internet. The system 104 typically includes one or more backhaul nodes 132. Upstream communications from user premises, as well as control messages from power line communication devices may be communicated to an access node 134, to a backhaul node 132, and then transmitted to an aggregation point 124 which is communicatively coupled to the IP network 126. Communications may traverse the IP network to a destination, such as a web server, power line server 118, or another end user device. The backhaul node 132 may be coupled to the aggregation point 124 directly or indirectly (i.e., via one or more intermediate nodes 127). The backhaul node 132 may communicate with its upstream device via any of several alternative communication media, such as a fiber optic cable (digital or analog (e.g., Wave Division Multiplexed)), coaxial cable, WiMAX, IEEE 802.11, twisted pair and/or another wired or wireless media. Downstream communications from the IP network 126 typically are communicated through the aggregation point 124 to the backhaul node 132. The aggregation point 124 typically includes an Internet Protocol (IP) network data packet router and is connected to an IP network backbone, thereby providing access to an IP network 126 (i.e., can be connected to or form part of a point of presence or POP). Any available mechanism may be used to link the aggregation point 124 to the POP or other device (e.g., fiber optic conductors, T-carrier, Synchronous Optical Network (SONET), and wireless techniques).

An access node 134 may transmit data to, and receive data from, one or more user devices 130 or other network destinations (e.g., utility meters). Other data, such as power line parameter data (e.g., current measured by a power line current sensor) may be received by an access node's power line communication device 139. The data typically enters the system 104 along a communication medium coupled to the access node 134. The data is routed through the system 104 to a backhaul node 132. Downstream data is sent through the network to a user device 130. Exemplary user devices 130 include a computer 130a, LAN, a WLAN, router 130b, Voice-over IP endpoint, game system, personal digital assistant (PDA), mobile telephone, digital cable box, security system, alarm system (e.g., fire, smoke, carbon dioxide, security/burglar, etc.), stereo system, television, fax machine 130c, HomePlug residential network, or other user device having a data interface. A user device 130 may include or be coupled to a modem to communicate with a given access node 134. Exemplary modems include a power line modem 136, a wireless modem 131, a cable modem, a DSL modem or other suitable modem or transceiver for communicating with its access node 134. The system also may be used to communicate utility usage data from an automated gas, water, and/or electric power meter.

A repeater node 135 may receive and re-transmit data (i.e., repeat the data), for example, to extend the communications range of other communication elements. As a communication traverses the communication network 104, backhaul nodes 132 and access nodes 134 also may serve as repeater nodes 135, (e.g., for other access nodes and other backhaul nodes 132). Repeaters may also be stand-alone devices without additional functionality. Repeaters 135 may be coupled to and repeat data on MV power lines or LV power lines (and, for the latter, be coupled to the internal or external LV power lines).

Backhaul Device 138:

As discussed, communication nodes, such as access nodes, repeaters, and other backhaul nodes, may communicate to and from the IP network (which may include the Internet) via a backhaul node 132. In one example embodiment, a backhaul node 132 comprises a backhaul device 138. The backhaul device 138, for example, may transmit communications directly to an aggregation point 124, or to a distribution point 127, which in turn transmits the data to an aggregation point 124.

Figure 2:
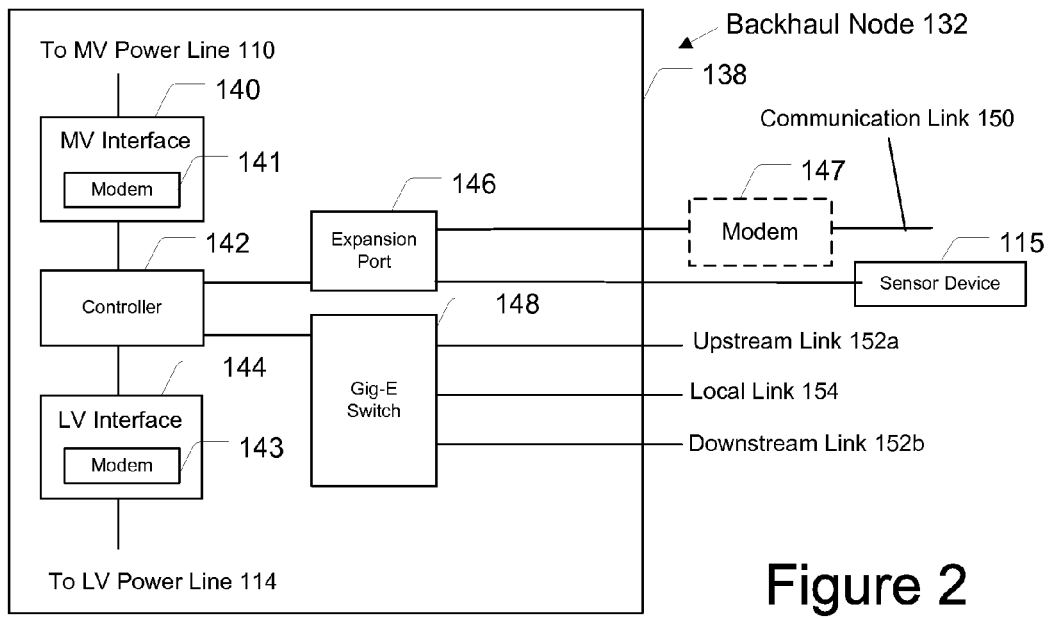
FIG. 2 is a block diagram of an example embodiment of a backhaul node and sensor device for implementing some embodiments of the present invention.
Figure 3:
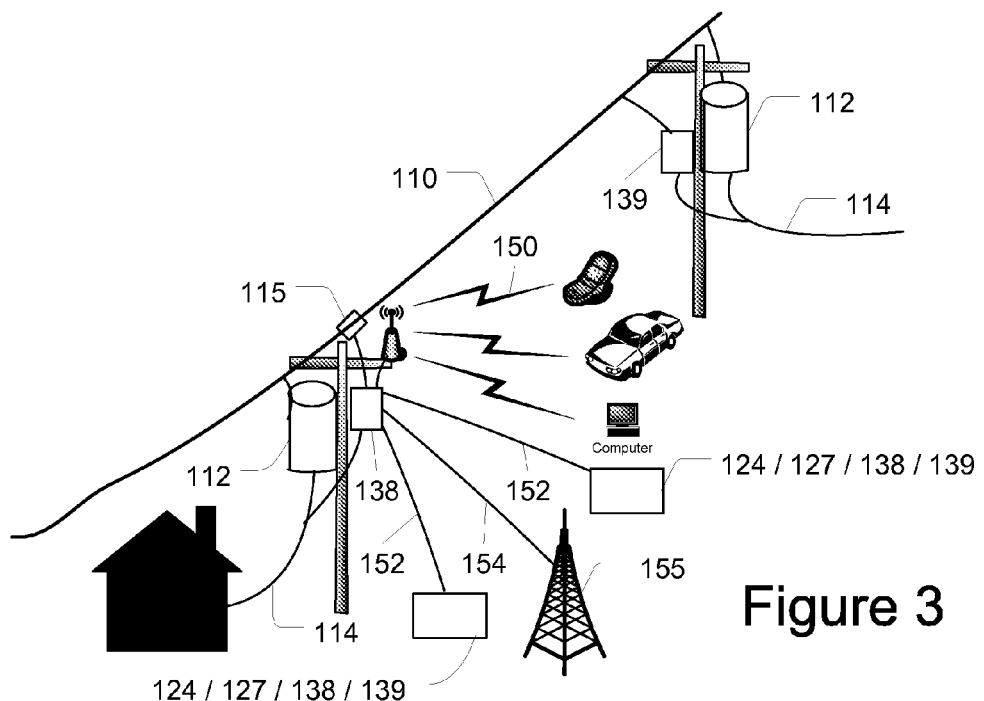
FIG. 3 illustrates an example implementation of an example embodiment of a backhaul node for implementing some embodiments of the present invention.

FIGS. 2 and 3 depict an example embodiment of a backhaul device 138, which may form all or part of a backhaul node 132. The backhaul device 138 may include a medium voltage power line interface (MV Interface) 140, a controller 142, an expansion port 146, and a gigabit Ethernet (gig-E) switch 148. In some embodiments the backhaul device 138 also may include a low voltage power line interface (LV interface) 144. The MV interface 140 is used to communicate over the MV power lines and may include an MV power line coupler (not shown) coupled to an MV signal conditioner, which may be coupled to an MV modem 141. The MV power line coupler prevents the medium voltage power from passing from the MV power line 110 to the rest of the device's circuitry, while allowing the communications signal to pass between the backhaul device 138 and the MV power line 110. The MV signal conditioner may provide amplification, filtering, frequency translation, and transient voltage protection of data signals communicated over the MV power lines 110. Thus, the MV signal conditioner may be formed by a filter, amplifier, a mixer and local oscillator, and other circuits which provide transient voltage protection. The MV modem 141 may demodulate, decrypt, and decode data signals received from the MV signal conditioner and may encode, encrypt, and modulate data signals to be provided to the MV signal conditioner for transmission.

The backhaul device 138 also may include a low voltage power line interface (LV Interface) 144 for receiving and transmitting data over an LV power line 114. The LV interface 144 may include an LV power line coupler (not shown) coupled to an LV signal conditioner, which may be coupled to an LV modem 143. In one embodiment the LV power line coupler may be an inductive coupler. In another embodiment the LV power line coupler may be a conductive coupler. The LV signal conditioner may provide amplification, filtering, frequency translation, and transient voltage protection of data signals communicated over the LV power lines 114. Data signals received by the LV signal conditioner may be provided to the LV modem 143. Thus, data signals from the LV modem 143 are transmitted over the LV power lines 114 through the signal conditioner and coupler. The LV signal conditioner may be formed by a filter, amplifier, a mixer and local oscillator, and other circuits which provide transient voltage protection. The LV modem 143 may demodulate, decrypt, and decode data signals received from the LV signal conditioner and may encode, encrypt, and modulate data signals to be provided to the LV signal conditioner.

The backhaul device 138 also may include an expansion port 146, which may be used to connect to a variety of devices. For example a wireless access point, which may include a wireless transceiver or modem 147, may be integral to or coupled to the backhaul device 138 via the expansion port 146. The wireless modem 147 may establish and maintain a communication link 150 with a plurality of devices. In other embodiments a communication link is established and maintained over an alternative communications medium (e.g., fiber optic, cable, twisted pair) using an alternative transceiver device connected to port 146. In such other embodiments the expansion port 146 may provide an Ethernet connection allowing communications with various devices over optical fiber, coaxial cable or other wired medium. In such embodiment the modem 147 may be an Ethernet transceiver (fiber or copper) or other suitable modem may be employed (e.g., cable modem, DSL modem). In other embodiments, the expansion port may be coupled to a Wifi access point (IEEE 802.11 transceiver), WiMAX (IEEE 802.16), or mobile telephone cell site. The expansion port may be employed to establish a communication link 150 between the backhaul device 138 and devices at a residence, building, other structure, another fixed location, or between the backhaul device 138 and a mobile device.

Various sensor devices 115 also may be connected to the backhaul device 138 through the expansion port 146 or via other means (e.g., a dedicated sensor device interface not shown). Exemplary sensors that may form part of a power distribution parameter sensor device 115 and be coupled to the backhaul device 138 may include, a current sensor, voltage sensor, a level sensor (to determine pole tilt), a camera (e.g., for monitoring security, detecting motion, monitoring children's areas, monitoring a pet area), an audio input device (e.g., microphone for monitoring children, detecting noises), a vibration sensor, a motion sensor (e.g., an infrared motion sensor for security), a home security system, a smoke detector, a heat detector, a carbon monoxide detector, a natural gas detector, a thermometer, a barometer, a biohazard detector, a water or moisture sensor, a temperature sensor, and a light sensor. The expansion port may provide direct access to the core processor (which may form part of the controller 142) through a MII (Media Independent Interface), parallel, serial, or other connection. This direct processor interface may then be used to provide processing services and control to devices connected via the expansion port thereby allowing for a more less expensive device (e.g., sensor). The sensor device 115 may measure and/or detect one or more power distribution system parameters, which, for example, may include power usage, power line voltage, power line current, detection of a power outage, detection of a street light failure, power delivered to a transformer, power factor (e.g., the phase angle between the voltage and current of a power line), power delivered to a downstream branch, harmonic components of a power signal, load transients, and/or load distribution. In addition, the backhaul device 138 may include multiple sensor devices 115 so that parameters of multiple power lines may be measured such as a separate parameter sensor device 115 on each of three MV power line conductors and a separate parameter sensor device 115 on each of two energized LV power line conductors and one on each neutral conductor. One skilled in the art will appreciate that other types of utility data also may be gathered. As will be evident to those skilled in the art, the expansion port may be coupled to an interface for communicating with the interface of the sensor device 114 via a non-conductive communication link (e.g., fiber optic, wireless, etc.) where necessary or a wired link.

The backhaul device 138 also may include a gigabit Ethernet (Gig-E) switch 148. Gigabit Ethernet is a term describing various technologies for implementing Ethernet networking at a nominal speed of one gigabit per second, as defined by IEEE standards. There are a number of different physical layer standards for implementing gigabit Ethernet using optical fiber, twisted pair cable, or balanced copper cable. In 2002, the IEEE ratified a 10 Gigabit Ethernet standard which provides data rates at 10 gigabits per second. The 10 gigabit Ethernet standard encompasses seven different media types for LAN, MAN and WAN. Accordingly the gig-E switch may be rated at 1 gigabit per second (or greater as for a 10 gigabit Ethernet switch).

The switch 148 may be included in the same housing or co-located with the other components of the node (e.g., mounted at or near the same utility pole or transformer). The gig-E switch 148 maintains a table of which communication devices are connected to which switch 148 port (e.g., based on MAC address). When a communication device transmits a data packet, the switch receiving the packet determines the data packet's destination address and transmits the packet via the port connected to the destination device rather than to every device in a given network. This greatly increases the potential speed of the network because collisions are substantially reduced or eliminated, and multiple communications may occur simultaneously.

The gig-E switch 148 may include an upstream port for maintaining an upstream communication link 152a with an upstream device (e.g., a backhaul node 132, an aggregation point 124, a distribution point 127), a downstream port for maintaining a downstream communication link 152b with a downstream device (e.g., another backhaul node 134; an access node 134), and a local port for maintaining a communication link 154 to a Gig-E compatible device such as a mobile telephone cell cite 155 (i.e., base station), a wireless device (e.g., WiMAX (IEEE 802.16) transceiver), an access node 134, another backhaul node 132, or another device. In some embodiments the gig-E switch 148 may include additional ports.

In one embodiment, the link 154 may be connected to a mobile telephone cell site configured to provide mobile telephone communications (digital or analog) and use the signal set and frequency bands suitable to communicate with mobile phones, PDAs, and other devices configured to communicate over a mobile telephone network. Mobile telephone cell sites, networks and mobile telephone communications of such mobile telephone cell sites, as used herein, are meant to include analog and digital cellular telephone cell sites, networks and communications, respectively, including, but not limited to AMPS, 1G, 2G, 3G, GSM (Global System for Mobile communications), PCS (Personal Communication Services) (sometimes referred to as digital cellular networks), 1× Evolution-Data Optimized (EVDO), and other cellular telephone cell sites and networks. One or more of these networks and cell sites may use various access technologies such as frequency division multiple access (FDMA), time division multiple access (TDMA), or code division multiple access (CDMA) (e.g., some of which may be used by 2G devices) and others may use CDMA2000 (based on 2G Code Division Multiple Access), WCDMA (UMTS)—Wideband Code Division Multiple Access, or TD-SCDMA (e.g., some of which may be used by 3G devices).

The gig-E switch 148 adds significant versatility to the backhaul device 138. For example, several backhaul devices may be coupled in a daisy chain topology (see FIG. 10), rather than by running a different fiber optic conductor to each backhaul node 134. Additionally, the local gig-E port allows a communication link 154 for connecting to high bandwidth devices (e.g., WiMAX (IEEE 802.16) or other wireless devices). The local gig-E port may maintain an Ethernet connection for communicating with various devices over optical fiber, coaxial cable or other wired medium. Exemplary devices may include user devices 130, a mobile telephone cell cite 155, and sensor devices (as described above with regard to the expansion port 146.

Communications may be input to the gig-E switch 148 from the MV interface 140, LV interface 144 or expansion port 146 through the controller 142. Communications also may be input from each of the upstream port, local port and downstream port. The gig-E switch 148 may be configured (by the controller 142 dynamically) to direct the input data from a given input port through the switch 148 to the upstream port, local port, or downstream port. An advantage of the gig-E switch 148 is that communications received at the upstream port or downstream port need not be provided (if so desired) to the controller 142. Specifically, communications received at the upstream port or downstream port may not be buffered or otherwise stored in the controller memory or processed by the controller. (Note, however, that communications received at the local port may be directed to the controller 142 for processing or for output over the MV interface 140, LV interface 144 or expansion port 146). The controller 142 controls the gig-E switch 148, allowing the switch 148 to pass data upstream and downstream (e.g. according to parameters (e.g., prioritization, rate limiting, etc.) provided by the controller). In particular, data may pass directly from the upstream port to the downstream port without the controller 142 receiving the data. Likewise, data may pass directly from the downstream port to the upstream port without the controller 142 receiving the data. Also, data may pass directly from the upstream port to the local port in a similar manner; or from the downstream port to the local port; or from the local port to the upstream port or downstream port. Moving such data through the controller 142 would significantly slow communications or require an ultra fast processor in the controller 142. Data from the controller 142 (originating from the controller 142 or received via the MV interface 140, the LV interface 144, or expansion port 146) may be supplied to the Gig-E switch 148 for communication upstream (or downstream) via the upstream port (or downstream port) according to the address of the data packet. Thus, data from the controller 142 may be multiplexed in (and routed/switched) along with other data communicated by the switch 148. As used herein, to route and routing is meant to include the functions performed by of any a router, switch, and bridge.

The backhaul device 138 also may include a controller 142 which controls the operation of the device 138 by executing program code stored in memory. In addition, the program code may be executable to process the measured parameter data to, for example, convert the measured data to current, voltage, or power factor data and to further process the measured current and voltage data to impedance data. The backhaul device 138 may also include a router, which routes data along an appropriate path. In this example embodiment, the controller 142 includes program code for performing routing (hereinafter to include switching and/or bridging). Thus, the controller 142 may maintain a table (e.g., a routing table) that identifies which communication device(s) is connected to each port in memory. The controller 142 may receive data from the MV interface 140, LV interface 144, switch 148 or the expansion port 146, and may route the received data to the MV interface 140, LV interface 144, the expansion port 146, or gig-E switch 148. In this example embodiment, user data may be routed based on the destination address of the packet (e.g., the IP destination address). Not all data packets, of course, are routed. Some packets received may not have a destination address for which the particular backhaul device 138 routes data packets (and be ignored by the device 138). Additionally, some data packets may be addressed to the backhaul device 138. In such case the backhaul device may process the data as a control message. Thus, the controller 142, of this embodiment, matches data packets with specific messages (e.g., control messages) and destinations, performs traffic control functions, performs usage tracking functions, authorizing functions, throughput control functions and similar related services.

Figure 4:
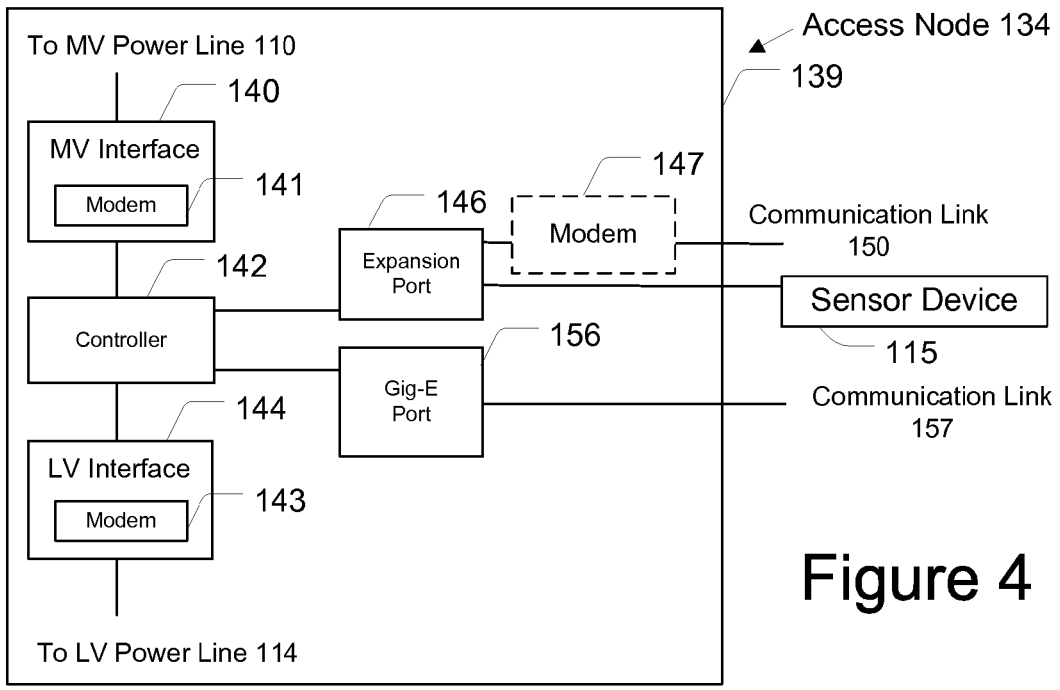
FIG. 4 is a block diagram of an example embodiment of an access node and sensor device for implementing some embodiments of the present invention.
Figure 5:
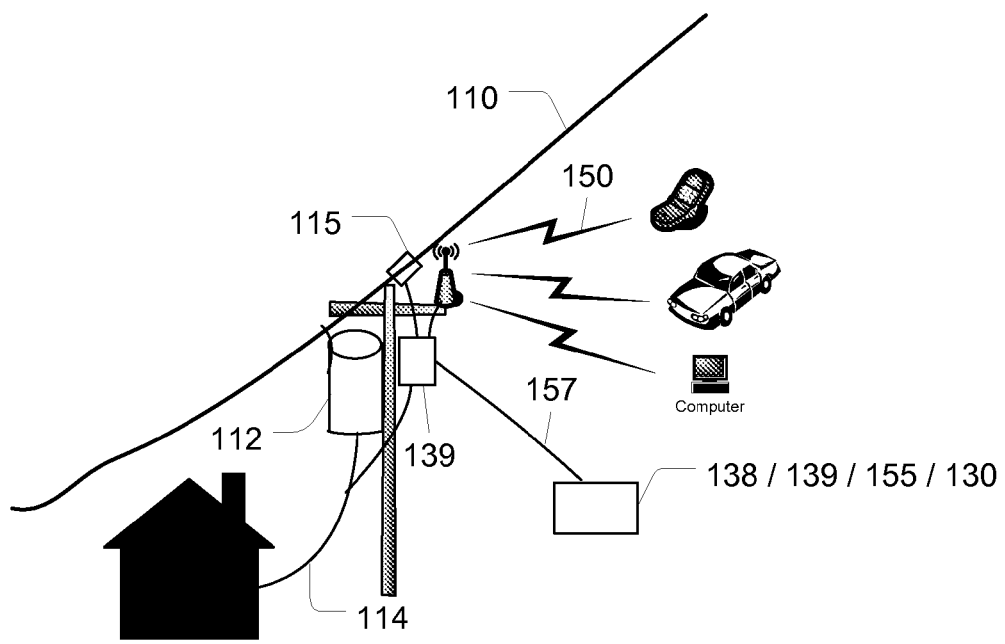
FIG. 5 illustrates an example implementation of an example embodiment of an access node for implementing some embodiments of the present invention.

Access Device 139:

The backhaul nodes 132 may communicate with user devices directly or via one or more access nodes 134, which may include an access device 139. FIGS. 4 and 5 show an example embodiment of such an access device 139 for providing communication services to mobile devices and to user devices at a residences, buildings, and other locations. Although FIG. 5 shows the access node 134 coupled to an overhead power line, in other embodiments an access node 134 (and its associated sensor devices 115) may be coupled to an underground power line.

In one example embodiment, access nodes 124 provide communication services for user devices 130 such as security management; IP network protocol (IP) packet routing; data filtering; access control; service level monitoring; service level management; signal processing; and modulation/demodulation of signals transmitted over the communication medium.

The access device 139 of this example node 134 may comprise a bypass device that moves data between an MV power line 110 and an LV power line 114. The access device 139 may include a medium voltage power line interface (MV interface) 140 having a MV modem 141, a controller 142, a low voltage power line interface (LV interface) 144 having a LV modem 143, and an expansion port 146, all of which may have the functionality and functional components (and for connecting to devices, such as sensor device 115) as previously described above with regard of the backhaul device 138. The access device 139 also may include a gigabit Ethernet (gig-E) port 156. The gig-E port 156 maintains a connection using a gigabit Ethernet protocol as described above for the gig-E switch 146 of FIG. 6. The sensor device 115 may be connected to the access device 139 to measure and/or detect one or more parameters of the MV power and/or the LV power line, which, for example, may include power usage, power line voltage, power line current, detection of a power outage, detection of a street light failure, power delivered to a transformer, power factor (e.g., the phase angle between the voltage and current of a power line), power delivered to a downstream branch, harmonics, load transients, and/or load distribution. In addition, the access device 134 may include multiple sensor devices 115 so that parameters of multiple power lines may be measured such as a separate parameter sensor device 116 on each of three MV power line conductors and a separate parameter sensor device on each of two energized LV power line conductors and one on each neutral conductor. One skilled in the art will appreciate that other types of utility data also may be gathered. The sensor devices 115 described herein may be co-located with the power line communication device with which the sensor device 115 communicates or may be displaced from such device (e.g., at the next utility pole or transformer).

The Gig-E port 156 may maintain an Ethernet connection for communicating with various devices over optical fiber, coaxial cable or other wired medium. For example, a communication link 157 may be maintained between the access device 139 and another device through the gig-E port 156. For example, the gig-E port 156 may provide a connection to user devices 130, sensor devices (as described above with regard to the expansion port 146, such as to power line parameter sensor device 115), a cell station 155, or a backhaul device 138.

The access device 139 may receive data from the MV interface 140, LV interface 144, the expansion port 146, or the gig-E port 156 and may route the data to the MV interface 140, LV interface 144, expansion port 146, or gig-E port 156 under the direction of the controller 142. In one example embodiment, the access node 134 may be coupled to a backhaul node 132 via a wired medium coupled to Gig-E port 156 while in another embodiment, the access node is coupled to the backhaul node 132 via an MV power line (via MV interface 140). In yet another embodiment, the access node 134 may be coupled to a backhaul node 132 via a wireless link (via transceiver connected to expansion port 146 or Gig-E port 156). In addition, the controller may include program code that is executable to control the operation of the device 139 and to process the measured parameter data to, for example, convert the measured data to current, voltage, power factor data or impedance data.

Other Devices:

Another communication device is a repeater (e.g., indoor, outdoor, low voltage (LVR) and/or medium voltage) which may form part of a repeater node 135 (see FIG. 1). A repeater serves to extend the communication range of other communication elements (e.g., access devices, backhaul devices, and other nodes). The repeater may be coupled to power lines (e.g., MV power line; LV power line) and other communication media (e.g., fiber optical cable, coaxial cable, T-1 line or wireless medium). Note that in some embodiments, a repeater node 135 may also include a device for providing communications to a user device 130 (and thus also serve as an access node 134).

In various embodiments a user device 130 is coupled to an access node 134 using a modem. For a power line medium, a power line modem 136 is used. For a wireless medium, a wireless modem is used. For a coaxial cable, a cable modem is may be used. For a twisted pair, a DSL modem may be used. The specific type of modem depends on the type of medium linking the access node 134 and user device 130.

In addition, the PLCS may include intelligent power meters, which, in addition to measuring power usage, may include a parameter sensor device 115 and also have communication capabilities (a controller coupled to a modem coupled to the LV power line) for communicating the measured parameter data to the access node 134. Detailed descriptions of some examples of such power meter modules are provided in U.S. patent application Ser. No. 11/341,646, filed on Jan. 30, 2006 entitled, "Power Line Communications Module and Method," which is hereby incorporated herein by reference in it entirety.

A power line modem 136 couples a communication onto or off of an LV power line 114. A power line modem 136 is coupled on one side to the LV power line. On the other side, the power line modem 136 includes a connector to connect to a wired or wireless medium leading to the user device 130. One protocol for communicating with access nodes 132 over an LV power line is the HomePlug (1.0, Turbo, or A/V) standard of the HomePlug® Alliance for communicating over low voltage power lines. In this manner, a customer can connect a variety of user devices 130 to the communication network 104.

Power Distribution Parameter Sensor Device:

In an example embodiment, the sensor device 115 may comprise a power line current sensor that is formed of a Rogowski coil and such sensor device may be installed throughout a network (on both MV and LV power lines). The Rogowski coil is an electrical device for measuring alternating current (AC) or high speed current pulses. An exemplary embodiment includes a first and second helical coils of wire (loops) electrically connected in series with each other. The first loop is wound with a substantially constant winding density in a first direction around a core that has a substantially constant cross section. The second loop is wound with a substantially constant winding density in a second direction around a core that has a substantially constant cross section. A conductor (e.g., a power line) whose current is to be measured traverses through the loops. A voltage may be induced in the coil based on the rate of change of the current running through the power line. Rogowski coils may have other configurations as well.

One advantage of a Rogowski coil is that it may be open-ended and flexible, allowing it to be wrapped around an energized conductor. Also, a Rogowski coil may include an air core (or other dielectric core) rather than an iron core, which gives the coil a low inductance and an ability to respond to fast-changing currents. Further, the Rogowski coil typically is highly linear, even when subjected to large currents, such as those of low voltage and medium voltage power lines. By forming the Rogowski coil with equally spaced windings, effects of electromagnetic interference may be substantially avoided. On method of providing equal spaced windings is to use printed circuit boards to manufacture the coil. Other types of current sensors also may be used as well.

A power line parameter sensor device 115 may be located in the vicinity of, and communicatively coupled to, a power line communication device 134, 135, 132 (referred to herein as power line communication device 137, which is meant to refer any of such devices). The power line parameter sensor device 115 measures (which may include simply detecting the presence of (or absence of) a parameter in some instances) a power distribution parameter, such as current, voltage, power delivered to a transformer data (i.e., wherein the sensor device is coupled the conductor that connects the distribution transformer to the MV power line), power factor (e.g., the phase angle between the voltage and current of a power line), power delivered to a downstream branch, harmonic components of a power signal, load transients, and/or load distribution. One skilled in the art will appreciate that other types of utility parameters also may be measured. The measured parameter may be sampled by the sensor device (or power line communication device 137) and communicated to a power line server 118 (or power line communication device 137), or other power line distribution management system and/or power line communication management system, which may process the data to determine whether the characteristics of the parameter match those of a triggering event (discussed below).

In addition, one sensor device 115 may be configured to provide data of more than one parameter. For example, a sensor device 115 may be configured to provide data of the voltage and current carried by the power line (and therefore have multiple sensors). One or more sensor devices 115 may be installed at a given power line 110 and/or 114 and be coupled to a corresponding power line communication device 137. For example, a power line current sensor device may be installed at power lines 110 and 114 alone or with another power line parameter sensor device (e.g., a power line voltage sensor device). Such a configuration may be used to determine the current and voltage (and allow computation of the power) into and out of a transformer. In addition, the data provided by the sensor device 115 may be used to determine additional parameters (either by the sensor device, the power line communication device, or a remote computer). For example, a sensor device 115 may be configured to measure the instantaneous voltage and current (e.g., over brief time period). The measurement data may be provided to the power line communication device 137 for processing. With adequate voltage and current sampling, the device 137 may compute the power factor of the power line (through means well known in the art). Thus, other power line parameters may be measured using an appropriate sensor device coupled to a power line 110, 114 in the vicinity of a power line communication device 137 in place of, or in addition to, a single power line current sensor device.

The sensor devices 115 and applications for using the related data also may be incorporated in power line communication systems that communicate over underground power lines. Detailed descriptions of the components, features, and power line communication devices of some example underground PLCS are provided in U.S. patent application Ser. No. 11/399,529 filed on Apr. 7, 2006 entitled, "Power Line Communications Device and Method," which is hereby incorporated herein by reference in its entirety. The sensor devices 115 described herein (or portions thereof) may be formed in or integrated with couplers for coupling communication signals to and from the power lines. For example, the Rogowski coils described above may be attached to the transformer side of the coupler (or integrated into the coupler) that couples to the underground (or overhead) MV power lines to allow installation of the coupler to also accomplish installation of the sensor device 115. Detailed descriptions of the components, features, and implementations of some example sensor devices are provided in U.S. patent application Ser. No. 11/555,740 filed on Nov. 2, 2006 entitled, "Power Line Communication and Power Distribution Parameter Measurement System and Method," which is hereby incorporated herein by reference in its entirety.

Software:

The communication network 104 may be monitored and controlled via a power line server (PLS) 118 that may be remote from the structure and physical location of the network elements. The controller of the nodes 128 describe herein may include executable program code for controlling the operation of the nodes and responding to commands and requests. The PLS 118 may transmit any number of commands to backhaul nodes 132 and access nodes 134 to manage the system. As will be evident to those skilled in the art, most of these commands are equally applicable for backhaul nodes 132 and access nodes 134. These commands may include altering configuration information, synchronizing the time of the node 128 with that of the PLS (and other nodes), controlling measurement intervals (e.g., current and voltage measurements), requesting measurement or data statistics, requesting the status of user device activations, rate shaping, and requesting reset or other system-level commands. Any or all of these commands may require a unique response from the node 128, which may be transmitted by the node 128 and received and stored by the PLS. The PLS may include software to transmit a command to any or all of the nodes (134 and 132) to schedule a voltage and/or current measurement at any particular time (or interval) so that all of the network elements of the PLCS take the measurement(s) at substantially the same time. Also, the PLS 118 may include location data (e.g., address, pole number, etc.) associated with each PLCD stored in memory so that a condition (e.g., a change in impedance, fault, etc.) reported by a PLCD can be readily known.

Alerts

In addition to commands and responses, the node 128 has the ability to send Alerts and Alarms to the PLS. Alerts typically are either warnings or informational messages transmitted to the PLS in light of events detected or measured by the node 128. Alarms typically are error conditions detected.

One example of an Alarm is an Out-of-Limit Alarm that indicates that an out-of-limit condition has been detected at the node 128, which may indicate a power outage on the LV power line, an MV or LV voltage too high, an MV or LV voltage too low, a temperature measurement inside the node 128 is too high, a power line impedance is too high or low, and/or other out-of-limit conditions. Information of the Out-of-Limit condition, such as the type of condition (e.g., a LV voltage measurement, impedance, or a node 128 temperature), the Out-of-Limit threshold exceeded, the time of detection or determination, the amount (e.g., over, under, etc.) the out of limit threshold has been exceeded, is stored in the memory of the node 128 and transmitted with the alert or transmitted in response to a request from the PLS. The transmitted data also includes information of the node (e.g., its address (MAC or IP), serial number, pole number, etc.) which is stored in memory of the PLS and allows the PLS to determine the location of the reporting node 128 if need be (in order to allow a utility to dispatch personnel).

ADC Scheduler

Any of the nodes described herein may include an analog to digital converter (ADC) for measuring the voltage, current, and/or other parameters of any power line 110, 114. The ADC may be located within the power line parameter sensor device 115 or within the power line communication device 137 (and connected to a transducer coupled to the power line). The ADC Scheduler software, in conjunction with the real-time operating system, creates ADC scheduler tasks to perform ADC sampling according to configurable periods for each sample type. Each sample type corresponds with an ADC channel. The ADC Scheduler software creates a scheduling table in memory with entries for each sampling channel according to default configurations or commands received from the PLS. The table contains timer intervals for the next sample for each ADC channel, which are monitored by the ADC scheduler.

ADC Measurement Software

The ADC Measurement Software, in conjunction with the real-time operating system, creates ADC measurement tasks that are responsible for monitoring and measuring data accessible through the ADC such as the sensor devices 115 (including the current sensor devices and voltage sensor devices) described herein. Each separate measurable parameter may have a separate ADC measurement task. Each ADC measurement task may have configurable rates for processing, recording, and reporting for example.

An ADC measurement task may wait on a timer (set by the ADC scheduler). When the timer expires the task may retrieve all new ADC samples for that measurement type from the sample buffer, which may be one or more samples. The raw samples are converted into a measurement value. The measurement is given the timestamp of the last ADC sample used to make the measurement. The measurement may require further processing. If the measurement (or processed measurement) exceeds limit values, an alert condition may be generated. Out of limit Alerts may be transmitted to the PLS and repeated at the report rate until the measurement is back within limits. An out of limit recovery Alert may be generated (and transmitted to the PLS) when the out of limit condition is cleared (i.e., the measured value falls back within limit conditions).

The measurements performed by the ADC, each of which has a corresponding ADC measurement task, may include node 128 inside temperature, LV power line voltage, LV power line temperature, MV power line temperature, LV power line current, MV power line voltage, transformer temperature, and/or MV power line current for example.

As discussed, the nodes may include value limits for many of these measurements stored in memory with which the measured value may be compared. If a measurement is below a lower limit, or above an upper limit (or otherwise out of an acceptable range), the node 128 may transmit an Out-of-Limit Alert. Such alert may be received and stored by the PLS. In some instances, one or more measured values are processed to convert the measured value(s) to a standard or more conventional data value (e.g., an impedance).

The LV power line voltage measurement may be used to provide various information. For example, the measurement may be used to determine a power outage (and subsequently a restoration), or measure the power used by a consumer (when current data is also available) or by all of the consumers connected to that distribution transformer. In addition, it may be used to determine the power quality of the LV power line by measuring and processing the measured values over time to provide frequency, harmonic content, and other power line quality characteristics. Further, as described below, it may be used, along with the turns ratio (and the tap used, if applicable) of the transformer (and known inefficiencies) to determine voltage input to the transformer.

Method for Determining Impedance and Location of Change in Impedance

As discussed, it is desirable to identify and locate power distribution conditions that may adversely affect power delivery. As discussed, a change in the impedance along a portion of a MV power line 110 (beyond a threshold change) may be indicative of an existing condition (e.g., tree limb intermittently touching the power line or a failing insulator) and/or predictive of a future adverse power distribution event (e.g., a fault).

A fault is an abnormal situation in which power flows through (or to) an unintended location, such to ground, to another electrical wire (e.g., another MV phase conductor, or a neutral). A transient fault is a fault that lasts only a short period of time. Faults in overhead power lines are often transient. For example, a tree momentarily contacting a power line may cause a transient fault and a change in impedance. Similarly, if a voltage arc is created in a power line due to lightning, the arc provides another path to ground thereby changing the impedance of the power line across the location of the arc. Likewise, a periodic fault (60 Hz) that may be associated with a deteriorating insulator or deteriorating insulation of an underground residential distribution (URD) power line cable may cause a periodic change in the impedance. Such transient faults (and change in impedance) may be predictive of (and be a precursor to) a permanent fault that causes a power outage (e.g., because a circuit breaker or fuse disconnects power to the area). It is desirable to locate such an imminent power fault before a power outage occurs as well as to locate conditions (e.g., tree limbs touching power lines) that may subsequently cause more a serious adverse condition.

Figure 6:
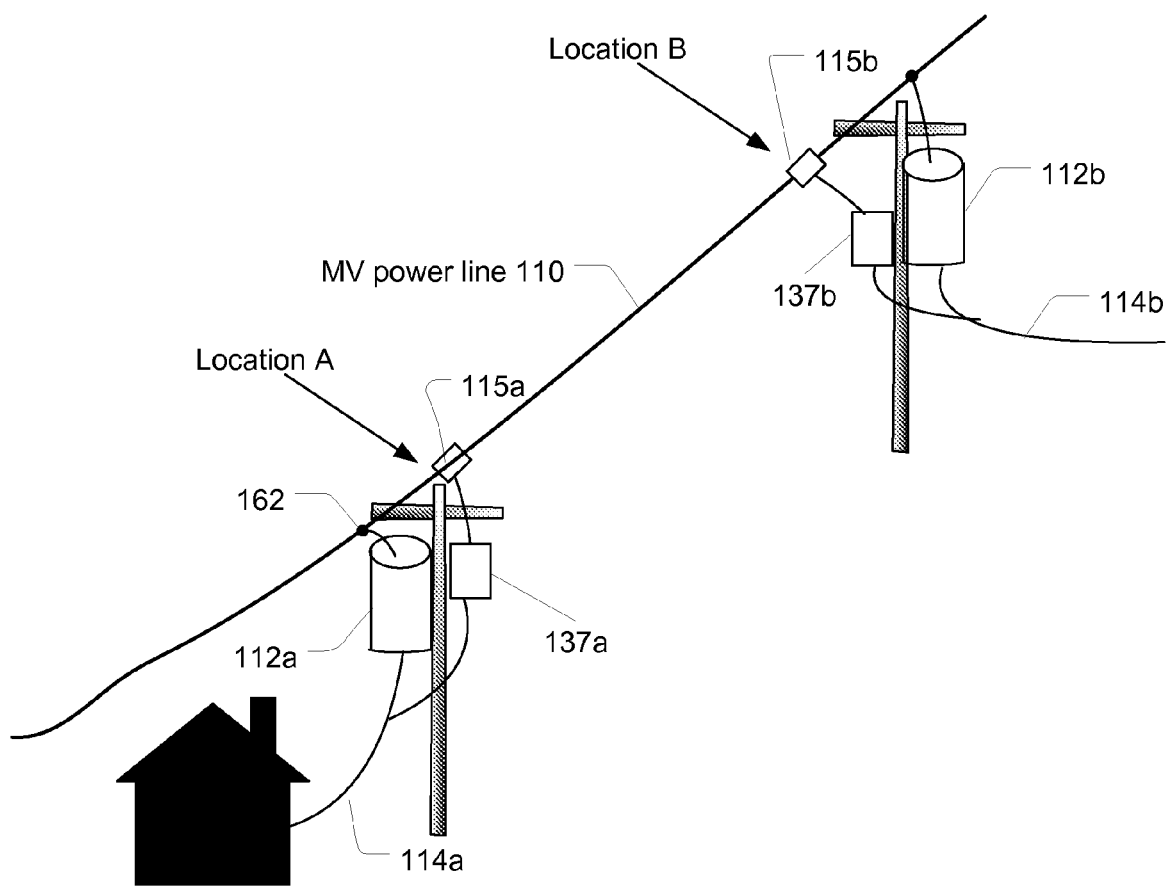
FIG. 6 illustrates a pair of power line communications device for implementing some embodiments of the present invention.

Referring to FIG. 6, one example embodiment of the present invention includes determining the voltage of the MV power line 110 at a first location (location A) by PLCD 137a and at second location (location B in the figure) by PLCD 137b. In addition, and concurrently with determining the voltages at points A and B, determining the current flowing from point A to B along the MV power line 110 by PLCD 137a or 137b. The impedance of the power line can be calculated by the equation Z=V/I. Consequently, the impedance of the power line between points A and B can be computed by:

$$Z=(V_A-V_B)/I;$$

where:

$V_A$=the voltage at location A;

$V_B$=the voltage at location B; and

I=the current flowing from location A to location B.

While the above equation is accurate, and such a system should work in principle, such a system may not be practical in all scenarios. First, the MV power line is designed to be low impedance and, therefore, the impedance of the power line between location A and location B will typically be vary small (e.g., on the order of milli-ohms or micro-ohms). Thus, the equipment used to make such measurements would have to be very precise (and therefore expensive). Second, because MV power lines carry very high voltages (e.g., usually 8,000 to 35,000 volts), it is difficult to measure the voltage and current of the MV power line because such equipment must be able to safely measure thousands of volts. In summary, due to the low impedance of the MV power line, the tolerances (e.g., accuracy) of the equipment needed to perform the measurements for the above equation, and the high voltage of the MV power line, the above implementation may not be practical in many scenarios and/or for widespread deployment a part of a system.

Other embodiments may include additional processes in order to overcome such obstacles. For example, a second embodiment includes the steps of determining the voltage of the MV power line 110 at the first location (location A) and at the second location (location B) at a first point in time. In addition, and concurrently with determining the voltages at points A and B, the process includes determining the current flowing from point A to B along the MV power line 110 at the first point in time. In addition, the embodiment further includes determining the voltage of the MV power line 110 at the first location (location A) and at the second location (location B) at a second point in time. In addition, the process includes determining the current flowing from point A to B along the MV power line 110 at the second point in time. As will be evident from the discussion below, making multiple measurements over time facilitates greater accuracy in the determination of the impedance of the MV power line and (perhaps more importantly), allows for more precise determinations of changes in the impedance of the power line between those locations.

According to the equation above, the impedance of the power line between locations A and B at time T1 is given by:

$$Z_{T1} = \frac{(V_{AT1} - V_{BT1})}{I_{T1}}$$

where:
$V_{AT1}$=the voltage at location A at time T1;
$V_{BT1}$=the voltage at location B at time T1; and
$I_{T1}$=the current flowing from location A to location B at time T1.

Similarly, the impedance of the power line between locations A and B at time T2 is given by:

$$Z_{T2} = \frac{(V_{AT2} - V_{BT2})}{I_{T2}}$$

where:
$V_{AT2}$=the voltage at location A at time T2;
$V_{BT2}$=the voltage at location B at time T2; and
$I_{T2}$=the current flowing from location A to location B at time T2.

Solving each of the above equations for I provides:

$$I_{T1} = \frac{(V_{AT1} - V_{BT1})}{Z_{T1}} \text{ and } I_{T2} = \frac{(V_{AT2} - V_{BT2})}{Z_{T2}}$$

Thus, an equation for the change in current from time T1 to time T2 is provided by:

$$I_{T1} - I_{T2} = \frac{(V_{AT1} - V_{BT1})}{Z_{T1}} - \frac{(V_{AT2} - V_{BT2})}{Z_{T2}}$$

As discussed, the impedance should remain constant over time so that $Z_{T1}=Z_{T2}$ expressed simply as Z in the equation below.

$$I_{T1} - I_{T2} = \frac{(V_{AT1} - V_{BT1}) - (V_{AT2} - V_{BT2})}{Z}$$

Solving for Z, the above equation becomes:

$$Z = \frac{(V_{AT1} - V_{BT1}) - (V_{AT2} - V_{BT2})}{I_{T1} - I_{T2}}$$

which provides:

$$Z = \frac{V_{AT1} - V_{BT1} - V_{AT2} + V_{BT2}}{I_{T1} - I_{T2}}$$

and provides:

$$Z = \frac{(V_{AT1} - V_{AT2}) - (V_{BT1} - V_{BT2})}{I_{T1} - I_{T2}}$$

or more simply, the impedance of the power line between location A and B is given by:

$$Z = \frac{\Delta V_A - \Delta V_B}{\Delta I}$$

referred below as Equation A
where:
$\Delta V_A$=the change in voltage from time T1 to T2 at location A;
$\Delta V_B$=the change in voltage from time T1 to T2 at location B; and
$\Delta I$=the change in current from time T1 to T2 between location A and B.

Thus, a system that periodically measures the voltage at two locations and the current flowing between the two locations, can use each set of measurement data along with past sets of measurement data to provide a reasonably accurate determination of the impedance of the power line as well as to detect changes in that impedance. It is worth noting that the change in current (from T1 to T2) referenced in the above equation and measured according various embodiments is the result in changes in the power loading of the MV power line (i.e., based on changes in power consumption by the power consumers). These changes may be substantial in practice and vary by multiples of two, four, or eight within a twenty-four hour time period. Larger changes in the current over time allow for greater accuracy of the measurement data.

Figure 7:
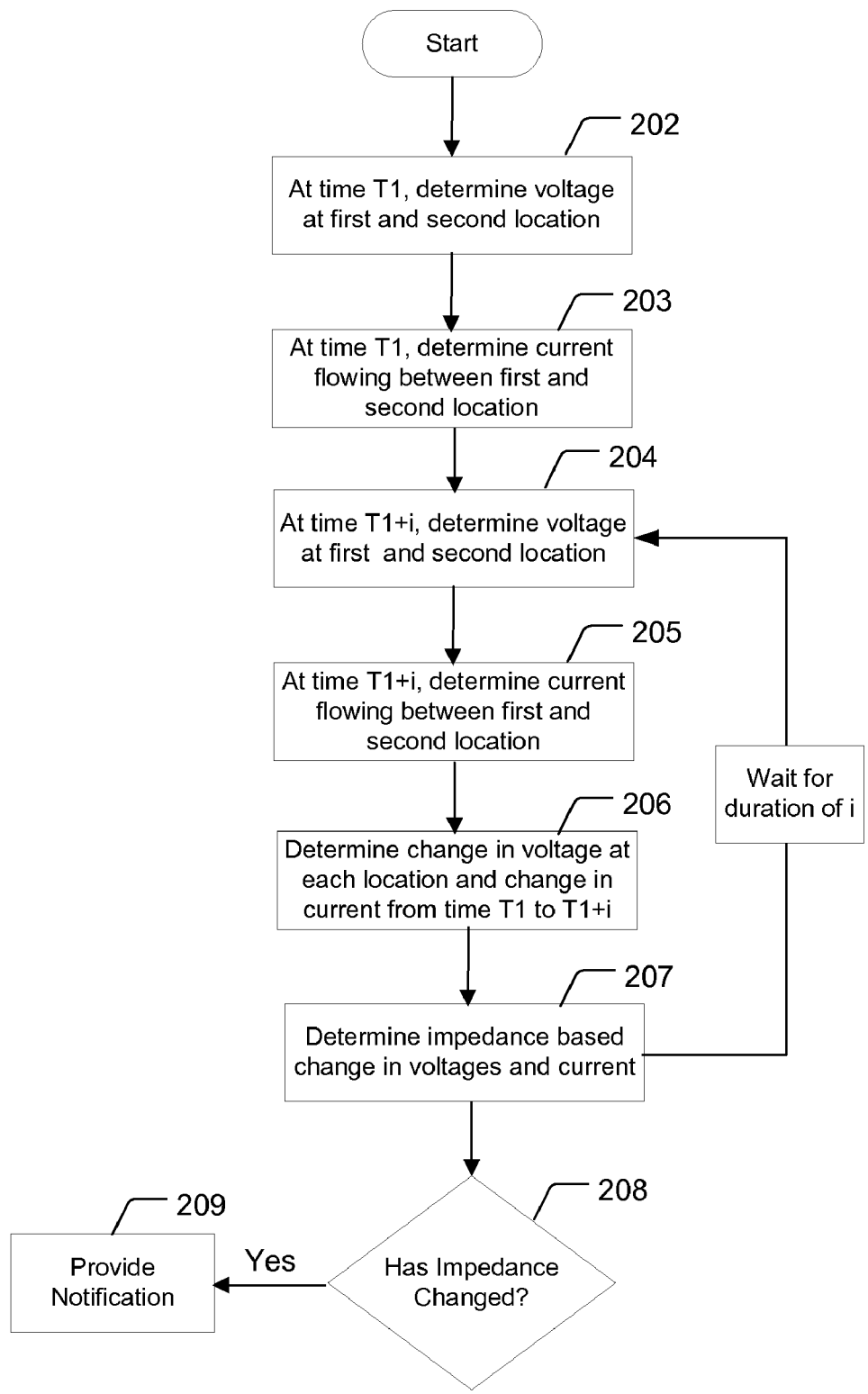
FIG. 7 is a flow chart illustrating processes for implementing an example embodiment of the present invention.

FIG. 7 is a flow chart of an example process for determining the impedance of a power line and for detecting a change in the impedance over time. As illustrated, at step 202 the process includes determining the voltage at the first and second locations at a first point in time (T1). Referring to FIG. 6, this process may be performed by PLCDs 137*a* and 137*b*, which determine the voltage at location A and location B, respectively. This step may be performed in any suitable manner such as measuring the voltage of the MV power relative to ground via a voltage measuring device (a volt meter). However, because the MV power line is carrying thousands of volts, measuring its voltage may not be as simple as connecting a volt meter to the MV power line (and to ground). Such a measuring device (typically a step down transformer) must be specifically designed to measure many thousands of volts. While such devices do exist, they are not inexpensive (and are bulky) and wide deployment of such volt meters across a power distribution system would not be economically practical. Consequently, another method of determining the voltage at location A and B includes measuring the voltage of the LV power line 114 and estimating the voltage on the MV power line 110. For example, PLCD 137*a* may include an ADC to measure the voltage of LV power line 114*a* (e.g., the voltage across the two energized conductors or the voltage from either energized conductor to ground), which is the output voltage of the distribution transformer 112*a*. In an example embodiment, the PLCD 137 may measure the RMS voltage of the LV power line 114 over one, two or more 60 Hz cycles and use the average voltage over the one or more cycles to perform further computations. In another embodiment, the peak voltage of the 60 Hz power is measured. In either case, the measurements at locations A and B by the two devices are taken concurrently (or substantially simultaneously). Thus, the devices may periodically receive a time synchronization control message or use other means (e.g., a GPS receiver) to ensure that the two devices are time synchronized and/or take the measurements concurrently.

The input voltage to the transformer 112*a* may be estimated based on the output voltage of the transformer 112*a* as measured on the LV power lines 114*a* by the PLCD 137*a*. Specifically, by knowing the turns ratio of the transformer 112 (and tap, if any) and the voltage of the LV power lines 114 the voltage input to the transformer may be computed (Vi/N1=Vo/N2; where N1 and N2 represent the turns ratio of the primary and secondary windings of the transformer 112, respectively). Because the sensor 115*a* (and location A) is located at substantially the same location as (or near) the tap connection 162 (i.e., the connection of the transformer 112*a* to the MV power line 114), the MV power line voltage at location A will be substantially the same as the voltage input to the distribution transformer 112*a*. Thus, the voltage of the MV power line 114 may be estimated by measuring the voltage of the LV power lines 114 and computing the voltage of the MV power line 110 based on the turns ratio of the distribution transformer 112. In one embodiment, the computation of the voltage of the MV power line 114 (based on the LV voltage and the turns ratio) at each location (location A and B) is performed by the nearby PLCD 137 (PLCD 137*a* and 137*b*) that is connected to the sensor device 115 (sensor devices 115*a* and 115*b*). In another embodiment, the computation of the voltage of the MV power line 114 (based on the LV voltage and the turns ratio) at each location (location A and B) is performed by a remote computer system (e.g., the PLS 118), which receives the voltage data of the measured LV power line 114 from each of the PLCDs 137*a,b*.

In each instance, the computation device (the PLCD or PLS) that is performing the computation may store the turns ratio for the distribution transformer(s) 112 associated with the sensor device 115 (or PLCD) in memory and retrieve the turns ratio to perform the computation of the MV voltage. In addition, because distribution transformers are not ideal, the computing device (the PLCD or PLS) may also factor in known or estimated voltage losses (or gains) by further reducing (or increasing) the computed MV voltage by a predetermined percentage or other amount before using the value to calculate the impedance. In either instance, the measured (e.g. MV current) and computed data (e.g., MV voltage) may be time stamped and stored in a memory along with (if performed by the PLS) information identifying the location and/or PLCD (or sensor device 115) performing the measurement.

A remote computer system performing such processing, such as the PLS, may receive data from each of a plurality of PLCDs 137 mounted across a portion of a power distribution system (e.g., one or more MV power lines such as all those connected to a substation) or throughout a geographical area (e.g., such as a zip code, city, county, etc.—encompassing multiple power distribution systems).

As illustrated in FIG. 6, the impedance measurements and monitoring is performed along a portion of the MV power line 110 that has no junctions. In other words, in this embodiment there are no transformers, branches, or devices connected to the MV power line 110 between location A and location B. If there was a transformer 112 or branch connected to the MV power line 110 between locations A and B, and the load (i.e., impedance) that is supplied power via MV power line (by way of the transformer, branch or device) changed, this change would be detected by the present invention. Measuring such a change may be useful in some scenarios where the utility wants to know the change in impedance of a load supplied power by a branch or transformer, or the change in impedance of a device. However, such a junction (transformer, branch, or device) connected between points A and B may prevent the system from detecting an adverse power distribution condition or imminent event. In other words, if there are one or more of such junctions between locations A and B, a change in the impedance between locations A and B might be the result of a change in impedance of the junction (to ground) and not an adverse power distribution condition or event (e.g., imminent fault). However, if the range of the impedance to ground of the junction is known (or can be determined), the system may still be used to detect a change in impedance that is above (or below) a threshold (that considers the upper and lower ranges of impedance to ground of the junction). Additionally, if the type of impedance is known, the system can be used to determine and detect changes in other types of impedances. For example, if a capacitor bank is connected to the MV power line between locations A and B, the capacitor bank will add a reactive load to ground when connected causing the MV voltage to increase. The system may be used to detect a change in the resistance (the real impedance), which can be accomplished by measuring the power factor of the power line (i.e., the phase angle between the current and voltage).

Referring to FIG. 7, at step 203 the process includes determining the current flowing between the first and the second location at the first point in time (T1). Referring to FIG. 6, each PLCD 137 of this example configuration includes a sensor device 115 that includes a current sensor for measuring the current flowing over the MV power line 115. Either or both PLCDs may measure the current flowing over the MV power line 110. The data (of voltage and current measurements) may be stored in memory of the respective PLCD 137 and/or may be transmitted (e.g., wirelessly, via fiber, or via the MV power line) to a remote computer system such as the PLS 118 for storage and processing.

At step 204, the process continues by measuring the voltage at locations A and B at a second point in time (at time T1+i). Referring to FIG. 6, in this example embodiment, at some point in time after T1 (at T1+i) each PLCD 137 measures the voltage of the LV power lines 114 and the voltage of the MV power line 110 is computed (e.g., computed by the PLCD or by the PLS with data received from the PLCD). In addition, at step 205 the process includes determining the current flowing between the first and the second location at the second point in time (T1+i), which may be performed by either or both PLCDs via their respective sensor devices 115. Again, the data (of voltage and current measurements) may be stored in memory of the respective PLCD 137 and/or may be transmitted (e.g., wirelessly, via fiber, or via the MV power line) to a remote computer system such as the PLS 118 for storage and processing.

At step 206, the change in voltage from time T1 to time T1+i at location A and location B is determined. This process may be performed by each PLCD or the PLS. In addition, the change in current at flowing over the power line 110 between points A and B may be computed by either PLCD (that makes the measurement) or the PLS, which receives the data from one or both PLCDs.

At step 207, the impedance of the MV power line 110 between locations A and B is computed based on the Equation A above and may be stored in memory. This may be performed by a remote computer system such as the PLS, which receives the necessary data from the PLCDs of the system 104. Alternately, this may be performed by one of the PLCDs 137 that receives voltage (or voltage and current data) from the other PLCD.

At step 208, a computing device determines whether the impedance of the MV power line between locations A and B has changed significantly. Again, this may be done by a remote computer such as the PLS 118 or a PLCD 137. In either instance, one method of performing process 208 includes comparing the determined impedance (the result of step 207) with the determined impedance resulting from previous sets of measurements. More specifically, the computing device may retrieve the most recent determined impedance from memory and (1) subtract the retrieved impedance from the determined impedance (the result of step 207) to determine the difference; (2) divide the retrieved impedance by the determined impedance (to determine a percent difference). Other suitable methods of determining the magnitude of the change in impedance and whether the magnitude of the change (if any) in impedance should result in any action (i.e., a notification) may be used.

If the impedance has changed significantly, a notification may be provided at step 209. Specifically, the PLS 118 (or other computing device) may transmit a notification (e.g., a communication reporting the event) to the utility provider to allow the utility provider to resolve the issue by dispatching personnel to investigate or correct the condition. In some embodiments, the utility personnel may be operating the PLS and the notification may simply be an audible or visual indicator of the condition. The notification may include location information sufficient for the utility to dispatch personnel to the street, distribution transformer(s), neighborhood, pole, PLCD, or other location associated with the condition.

In one embodiment, the MAC address of the communication identifies the source device (e.g., the PLCD 137) from which the communication originated. Such address may be correlated to a pole number (and then to a location) or to a street address. The communication also may include one or more codes among a range of potential codes. For example, there may be a specific code for each reportable power distribution parameter condition and event. A specific code may be transmitted with an SNMP trap according to the specific power distribution parameter event detected. The reported power distribution parameter event (e.g., trigger event) may be used by the PLS 118 to determine the identify of the corresponding power distribution event (e.g., fault; outage, imminent outage, impedance change, etc.).

The particular pattern of a determined change in impedance may be a signature for a specific type of power distribution condition (e.g., a failing insulator). For example, a change in impedance that is intermittently (and/or that occurs during windy conditions) and on an overhead power line may be associated with a tree limb touching the overhead power line. A change in impedance that occurs at a 60 Hz or 120 Hz cycle (e.g., at the peak of the power voltage) may indicate faulty insulation (or elbow) on an URD power cable and may indicate a failing insulator on an overhead power line. Thus, the signature (i.e., the characteristics such as variations over time and/or magnitude) of a change in impedance may be characteristic of particular power distribution parameter condition. Consequently, data sufficient for identifying a plurality of signatures representing different conditions for overhead and underground power line may be stored in memory. Thus, in addition to detecting and reporting a change in impedance, the PLS or other computer system may store data of a plurality of impedances (e.g., data of a sequence of impedances) and associated timing information, to be compared with signature impedance data representative of one or more particular condition(s) stored in memory. Thus, the PLS may process the changes in impedance (i.e., process the value of the impedance over time) to determine if the changes are cyclic (e.g., 60 Hz or 120 Hz), intermittent, or isolated changes. The notification provided (e.g., step 209) may then include information suggesting a condition (or conditions) more likely to be causing the condition(s).

Figure 8:
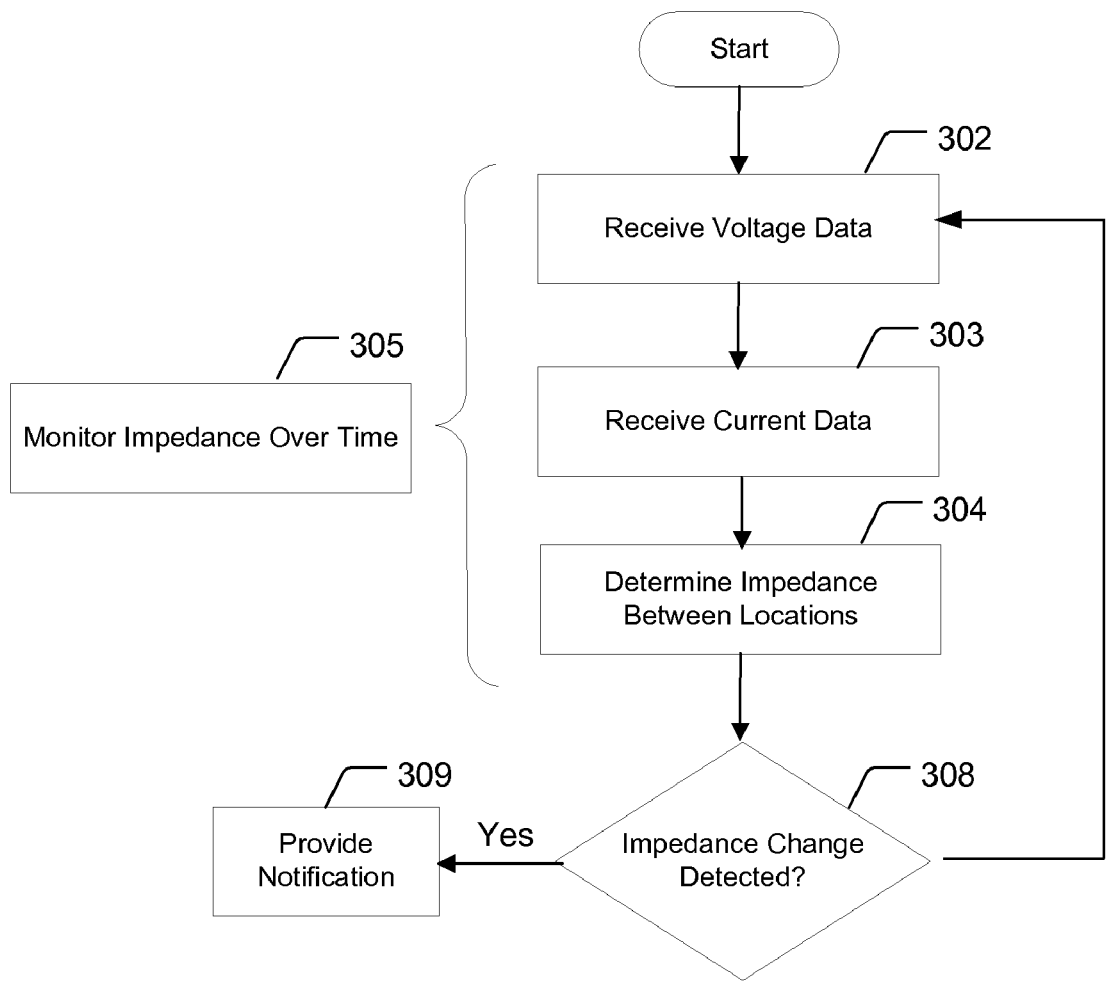
FIG. 8 is a flow chart illustrating processes for implementing another example embodiment of the present invention.

FIG. 8 illustrates an example process for determining the impedance of power lines and for detecting changes in impedance of the power lines. This process may be implemented, for example, a remote computer system receiving data from multiple sensor devices. At step 302 the process includes receiving voltage data comprising data of the voltage of the power lines at each of a plurality of locations at a plurality of different points in time. The voltage data may include MV voltage measurement data or low voltage measurement data in which case the process may further include determining a medium voltage by multiplying the low voltage data from each of the plurality of locations with a turns ratio of a transformer. At step 303 the process includes receiving current data comprising data of the current flowing between adjacent locations of the plurality of locations at the plurality of points in time. The current data may be received from one PLCD of each pair of adjacent locations or from both PLCDs. Next, the process includes determining an impedance of the power lines between the plurality of adjacent locations based on the voltage data and current data. This step may be performed using Equation A above in which the change in voltage over time at adjacent locations and the change in current between adjacent locations is used to compute the impedance. Other methods of determining the impedance along a segment the power line may also be used. At step 308 the process includes detecting a change in the impedance. In one embodiment, each time a new set of voltage data and current data associated with adjacent locations is received, the impedance is computed and compared with past computed impedances (or a threshold impedance) to determine if the impedance has changed. Thus, this step 308 may include comparing newly determined impedances of the power lines between the plurality of locations with previously determined impedances. Further, the process may include monitoring the impedance of the power lines between adjacent locations over time as illustrated by step 305. At step 309, the process includes providing a notification of a change in the impedance of a power line between adjacent locations upon detection of a change in the impedance beyond a threshold change (e.g., a predetermined percentage difference, a predetermined difference (in ohms), etc.). The notification may include any suitable notification (visual, audible, email, etc.) and may include location information. The order of the example processes described herein (and illustrated in FIGS. 7 and 8) may be changed without departing from the scope of the invention. For example, current data may be received and/or determined before voltage data. In addition, monitoring the impedance may, in practice, comprise performing other steps (e.g., steps 302, 303, 304, and 308) on an ongoing basis.

In an alternate embodiment, the MV power line voltage at location A and B do not need to be absolutely known and it is the change in voltage at location A and B over time that can be used to determine the impedance. Because the voltage of the low voltage power line connected to the distribution transformer 112 is proportional to its input voltage (and the MV power line voltage) it may not be necessary to compute the voltage of the MV power line. Instead, the change of the voltage of the LV power lines of distribution transformers 112a,b may be used in Equation A. While this computation will not provide an absolute value of the impedance of the MV power line between locations A and B, changes in the respective LV power line voltages can be used with changes of the MV current in Equation A to provide a value that is proportional to the impedance and that should remain constant. When this value is monitored over time, changes in the impedance can thereby be detected. This method has the advantage of not needing to know the turns ratio of the transformer. In addition, many transformers have multiple taps and this method does not need information of which tap of the transformer is used.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention.

What is claimed is:

1. A method of determining an impedance of a medium voltage power line having a finite characteristic impedance, comprising:
   determining a first voltage comprising the voltage of the power line at a first location at a first time;
   determining a second voltage comprising the voltage of the power line at a second location at the first time;
   determining a first current comprising the current flowing between the first location and the second location of the power line at the first time;
   determining a third voltage comprising the voltage of the power line at the first location at a second time;
   determining a fourth voltage comprising the voltage of the power line at the second location at the second time;
   determining a second current comprising the current flowing between the first location and the second location of the power line at the second time;
   determining a first voltage change comprising the difference between the first voltage and the third voltage;
   determining a second voltage change comprising the difference between the second voltage and the fourth voltage;
   determining a current change comprising the difference between the first current and the second current;
   determining the impedance by dividing the difference between the first voltage change and the second voltage change by the current change; and
   outputting data of the determined impedance.

2. The method according to claim 1, further comprising:
   storing one or more distribution transformer turns ratios in a memory; and
   wherein:
   said determining a first voltage comprises multiplying voltage data of a first low voltage power line by a turns ratio of a first distribution transformer; and
   said determining a second voltage comprises multiplying voltage data of a second low voltage power line by a turns ratio of a second distribution transformer.

3. A method of determining an impedance of a medium voltage power line having a finite characteristic impedance, comprising:
   determining a first voltage change comprising data of a change in a voltage at a first location of the power line between a first time and a second time;
   determining a second voltage change comprising data of a change in a voltage at a second location of the power line between the first time and the second time;
   determining a current change comprising a change in the current flowing between the first location and the second location of the power line between the first time and the second time;
   determining the impedance by dividing the difference between the first voltage change and the second voltage change by the current change; and
   outputting data of the determined impedance.

4. The method according to claim 3, further comprising:
   detecting a change in the impedance of the power line above a predetermined threshold; and
   providing a notification of the change in the impedance.

5. The method according to claim 3, wherein the data of a change in a voltage at the first location comprises data of a change in a voltage of a low voltage power line.

6. The method according to claim 3, wherein the data of a change in a voltage at the first location comprises data of a change in a voltage of the medium voltage power line.

7. A method of determining an impedance of a medium voltage power line having a finite characteristic impedance, comprising:
   a. receiving, from a first device, first voltage data comprising data of the voltage of the power line at a first location at a first time;
   b. receiving, from a second device, second voltage data comprising data of the voltage of the power line at a second location at the first time;
   c. receiving first current data comprising data of the current flowing between the first location and the second location of the power line at the first time;
   d. receiving, from the first device, third voltage data comprising data of the voltage of the power line at the first location at a second time;

e. receiving, from the second device, fourth voltage data comprising data of the voltage of the power line at the second location at the second time;

f. receiving second current data comprising data of the current flowing between the first location and the second location of the power line at the second time;

g. determining a first voltage change that comprises a difference between the first voltage data and the third voltage data;

h. determining a second voltage change that comprises a difference between the second voltage data and the fourth voltage data;

i. determining a current change that comprises a difference between the first current data and the second current data;

j. determining an impedance of the power line between the first location and the second location by dividing the difference between the first voltage change and the second voltage change by the current change; and outputting data of the determined impedance.

8. The method according to claim 7, further comprising:
storing one or more distribution transformer turns ratios in a memory;
determining a voltage of the medium voltage power line at the first location by multiplying the first voltage data by a turns ratio of a first distribution transformer; and
determining a voltage of the medium voltage power line at the second location by multiplying the second voltage data by a turns ratio of a second distribution transformer.

9. The method according to claim 7, further comprising:
repeating steps a through j;
determining the impedance determined by step j differs from a previously determined impedance by a predetermined amount; and
providing a notification of a change in impedance.

10. A method of detecting changes in an impedance of a plurality of medium voltage power lines, each having a finite characteristic impedance, comprising:
receiving voltage data comprising data of the voltage of the power lines at each of a plurality of locations at a plurality of different points in time;
receiving current data comprising data of the current flowing between adjacent locations of the plurality of locations at each of the plurality of points in time;
repeatedly determining the impedance of the power lines between each of the plurality of adjacent;
detecting a change in the impedance of the power lines between one or more of the plurality of adjacent locations;
providing a notification of the detection of the one or more changes in impedance; and
wherein said determining the impedance of the rower lines between each of the plurality of adjacent locations comprises:
determining a voltage change at each location over time;
determining a current change comprising a change in the current flowing between adjacent locations over time; and
dividing a difference between the voltage changes of adjacent locations by the current change between the adjacent locations.

11. The method according to claim 10, wherein the voltage data comprises data of the voltage of a low voltage power line, the method further comprising:
storing one or more distribution transformer turns ratios in a memory; and
determining a medium voltage by multiplying the voltage data of each of the plurality of locations with a turns ratio of a distribution transformer.

12. The method according to claim 10, further comprising for the impedance between each of the plurality of adjacent locations, comparing a determined impedance with one or more previously determined impedances.

13. A method of detecting changes in the impedance of a plurality of medium voltage power lines, each having a finite characteristic impedance, comprising:
receiving voltage data comprising data of the voltage of the power lines at each of a plurality of locations at a plurality of different points in time;
receiving current data comprising data of the current flowing between adjacent locations of the plurality of locations at the plurality of points in time;
repeatedly determining information of an impedance of the power lines between a plurality of adjacent locations based on the voltage data and current data;
detecting a change in the impedance of a power line between adjacent locations;
providing a notification of a change in the impedance of a power line between adjacent locations upon detection of a change in the information of the impedance beyond a threshold change; and
wherein said determining information of the impedance of the rower lines comprises:
determining a voltage change at each location over time;
determining a current change comprising a change in the current flowing between adjacent locations over time; and
dividing a difference between the voltage changes of adjacent locations by the current change between the adjacent locations.

14. The method according to claim 13, wherein the voltage data comprises data of the voltage of a low voltage power line, the method further comprising:
storing one or more distribution transformer turns ratios in a memory; and
determining a medium voltage by multiplying the voltage data of each of the plurality of locations with a turns ratio of a distribution transformer.

15. The method according to claim 13, wherein said detecting comprises comparing determined impedances of the power lines between the plurality of locations with previously determined impedances.

16. The method according to claim 13, wherein:
a characteristic of a change in the impedance is detected that corresponds to one or more types of power line events; and
said notification includes information of the one or more types of power line events corresponding to the detected change in impedance.

17. The method according to claim 16, wherein the notification includes data indicating that a change in impedance comprises one of an increase in impedance and a decrease in impedance.

18. The method according to claim 13, wherein the information of the impedance comprises a value proportional to the impedance of the power line between adjacent locations.

19. The method according to claim 13, wherein the information of the impedance comprises a value of the impedance of the power line between adjacent locations.

* * * * *